United States Patent [19]

Rohner

[11] 4,302,793
[45] Nov. 24, 1981

[54] ELECTRONIC COOLING

[75] Inventor: Thomas G. Rohner, Midland, Tex.

[73] Assignee: Submergible Oil Systems, Inc., Midland, Tex.

[21] Appl. No.: 99,016

[22] Filed: Nov. 30, 1979

[51] Int. Cl.³ .............................................. H05K 7/20
[52] U.S. Cl. ................................. 361/385; 174/15 R
[58] Field of Search .......................... 165/80 C, 80 E; 174/15 R; 361/334, 381–385, 386, 388

[56] References Cited

U.S. PATENT DOCUMENTS

| 3,858,090 | 12/1974 | Lehmann | 361/385 |
| 4,091,439 | 5/1978 | Blair, Jr. | 361/385 |

OTHER PUBLICATIONS

Liquid–Cooled Elect. Components for Low-End Machines, Cunavelis, IBM Tech. Discl. Bull., vol. 17, No. 3, Aug. 1974, p. 884.

Primary Examiner—Gerald P. Tolin
Attorney, Agent, or Firm—Wendell Coffee

[57] ABSTRACT

Electronic components are mounted upon a chassis which slides vertically inside a tank. The components are normally cooled by circulating transformer oil around them. When inspection, maintenance or repair work is required, the bottom of the chassis is sealed to the side of the tank, an opening in the bottom of the chassis is closed and the chassis elevated by pumping the transformer oil beneath the chassis bottom.

10 Claims, 2 Drawing Figures

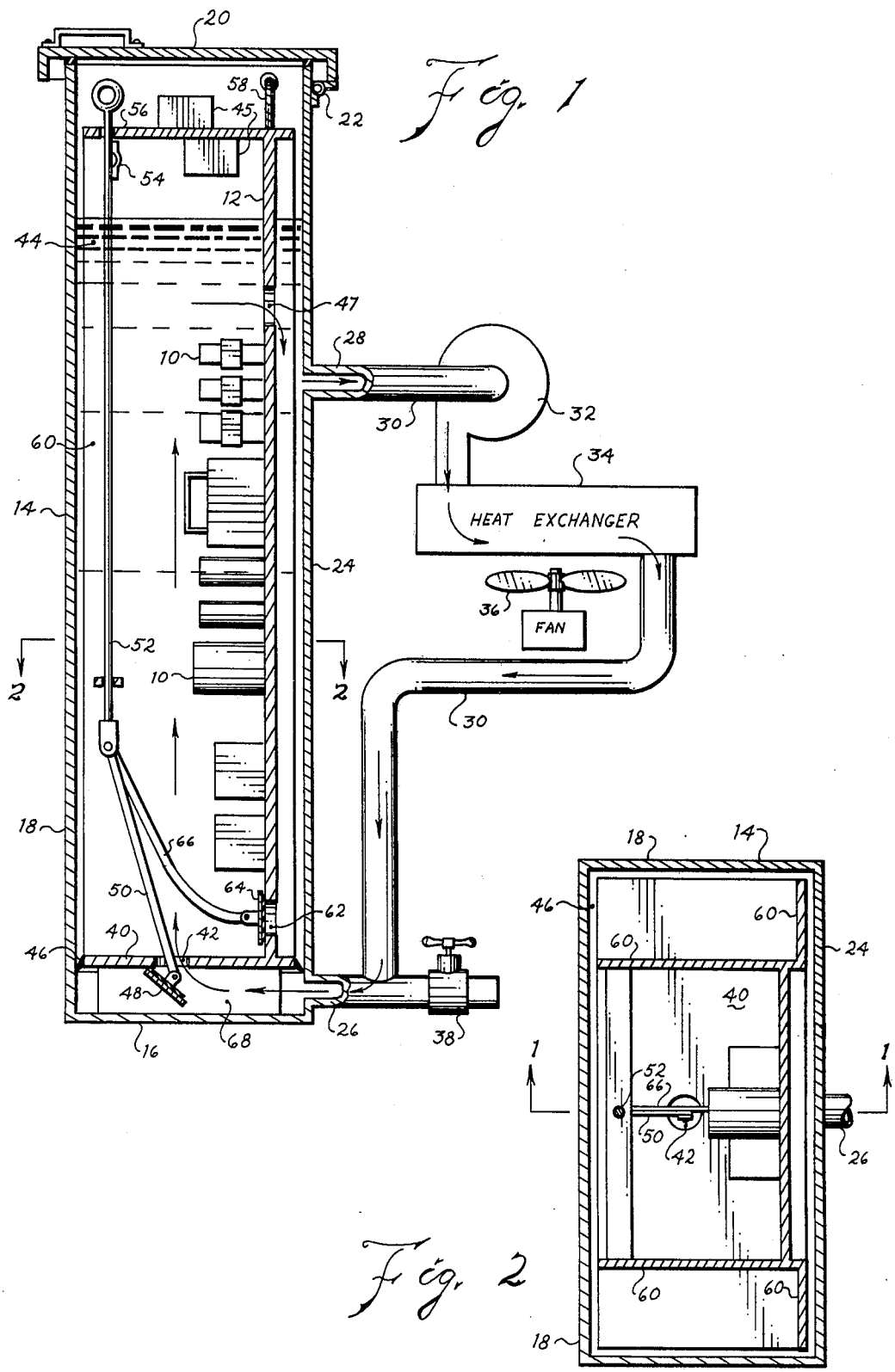

ELECTRONIC COOLING

BACKGROUND OF THE INVENTION (1) Field of the Invention

This invention relates to electronic controls and more particularly to cooling and maintaining electronic components.

(2) Description of the Prior Art

In the production of oil and other petroleum products and in other industrial applications, the use of automatic or electronic controls is increasing. In such instances, the wells are often located at remote points. To have electronic controls, it is often necessary that the components be cooled. At the present time, they are usually air cooled by having fans blow ambient air about the electronic controls. In many applications, this produces a problem of filtering dust and dirt from the air. Maintenance of filters, often by persons who are not particularly skilled in electronic maintenance work, is necessary. Because of their remote location, it must be expected that the normal well service personnel also do at least routine maintenance on the electronic equipment. Although these well service personnel are highly skilled in the maintenance of electric motors and the well pumping equipment, they are not particularly skilled in electronic maintenance.

This description of the prior art is particularly directed to oil field equipment, but it will be recognized that electronic controls are being increasingly utilized around equipment wherein the environment is not suitable for air cooling. cl SUMMARY OF THE INVENTION (1) New and Different Function I have discovered that electronic components are more advantageously cooled by submerging them in transformer oil, i.e., a liquid with high electrical resistance and desirable dielectric properties.

However, with using liquid cooling, the maintenance of the equipment presents a problem. Normally, the equipment is too heavy to be manually lifted from a tank of liquid. E.g., some equipment will occupy a space which is over five feet tall (over 1.5 meters) and over three square feet (over 0.25 sq. meters) in cross section and may weigh as much as 1,000 pounds (about 500 kg).

However, I have developed procedures whereby the normal circulating pump used to circulate the cooling liquid can also be used as an elevator to raise the chassis upon which the electronic components are mounted. By placing a leather seal around the base of the chassis the pump is used to elevate the chassis.

Therefore, it may be seen that the total function achieved by the combination of the parts far exceeds the sum of the functions of the individual elements such as, pumps, heat exchangers, seals and the like. Particularly, the function of the circulating pump in the combination exceeds merely the function of circulating fluid since it also functions to elevate the chassis.

(2) Objects of this Invention

An object of this invention is to cool and maintain electronic components.

Further objects are to achieve the above with a device that is sturdy, compact, durable, lightweight, simple, safe, efficient, versatile, ecologically compatible, energy conserving, and reliable, yet inexpensive and easy to manufacture, install, adjust, operate and maintain.

Other objects are to achieve the above with a method that is versatile, ecologically compatible, energy conserving, rapid, efficient, and inexpensive, and does not require highly skilled people to install, adjust, operate, and maintain.

The specific nature of the invention, as well as other objects, uses, and advantages thereof, will clearly appear from the following description and from the accompanying drawing, the different views of which are not scale drawings.

BRIEF DESCRIPTION OF THE DRAWINGS

FIG. 1 is a schematic representation of a side sectional view of the invention, taken on line 1—1 of FIG. 2.

FIG. 2 is a sectional view taken substantially on line 2—2 of FIG. 1, also somewhat schematic in representation.

DESCRIPTION OF THE PREFERRED EMBODIMENTS

Referring to the drawings there may be seen an electronic device having various components 10. As is customary, the components are mounted upon chassis 12. When the term "components" or "electronic components" is used herein it is meant any element, instrument or object having electrical current flowing therethrough.

In my invention, the chassis with the components are contained within tank 14. The tank has bottom 16, sides 18 and top 20. For convenience in obtaining access to the components the top 20 is hinged to the sides by hinge 22. Of course, the top could be opened from the tank 14 by means other than the hinges 22. One of the sides is designated the back 24.

Inlet 26 is at the bottom of the back 24 for the inlet of cooling liquid. As discussed above, the cooling liquid is normally designated as transformer oil by which is meant some liquid which has suitable characteristics so that it in no way interferes with the operation of the electronic components which may be submerged therein. Outlet 28, is spaced down from the top of the tank.

Suitable piping 30 connects the outlet 28 to the inlet of circulating pump 32. The outlet of the circulating pump is connected to heat exchanger 34 which is air cooled, preferably by having forced air circulated over it from motor driven fan 36. The cooling liquid from the heat exchanger 34 is then conveyed to the inlet 26 of the tank 14. Drain valve 38 is conveniently located at the junction of the piping 30 from the heat exchanger to the inlet 26.

The bottom 40 of the chassis is a sheet or plate of materials with hole 42 therethrough. The hole 42 is normally open. The tank 14 is filled with cooling liquid 44 to a level well above the outlet 28 near the top of the tank. There is a space from the top of the tank which is not filled with cooling liquid, this space without cooling liquid is left for dry components 45 upon the chassis 12 that are not submerged in the liquid 44. The chassis and the components will displace a certain amount of liquid and, therefore, with the chassis submerged in liquid, the liquid level will be higher than when the chassis is lifted out. However, even with the chassis completely removed from the liquid, the outlet 28 is below the level of liquid at that time.

Therefore, it may be seen with the hole 42 open and the pump 32 operating that cooling liquid will enter through the inlet opening 26 at the bottom of tank 14 and will move upward through the tank around the components 10 past the chassis 12 and out through the outlet 28 back to the pump 32. There is an opening at the top of the chassis between the top of the liquid level and above the outlet 28 to permit the cooling liquid 44 to flow from the component side of the chassis 12 to the outlet opening 28.

Seal 46 extends around the bottom 40 of the chassis. The seal 46 is in the form of a leather or elastomer which is securely attached to the bottom and is resiliently pressed against the sides 18 of the tank 14. The cross section configuration of the tank between the top 20 and bottom 16 is uniform. Therefore, as the bottom moves up and down the tank, the seal 46 effectively prohibit the liquid 44 from moving below the bottom 40 to above the bottom 40. As will be explained later, this seal does not need to be perfectly fluid tight and the system can tolerate a considerable leakage bypassing of the liquid around the seals.

Hole 42 may be closed by bottom valve 48. The valve is hinged at one edge to the bottom of bottom 40. The valve is attached by ears on top of the valve to pitman 50 which is hinged to valve plunger or operator 52. Although normally the pressure on the valve 48 will hold the valve closed, the valve operator 52 may have spring or detent 54 near the top thereof. By pulling upward on valve plunger 52, the valve 48 may be closed. Pressure detent 54 would cooperate with chassis top 56 to hold the valve operator or plunger 52 up and the valve 48 closed.

Therefore, if an operator desires to have access to the components 10 for repair, maintenance or inspection, all he needs to do is to remove the top 20 and pull upward on the valve plunger 52, thus closing the valve 48. The pump 32 continues to pump liquid 44 through the inlet 26 which is below the chassis bottom 40. The bottom 40 is supported above bottom 12 by feet 68. Therefore, this additional fluid below the chassis bottom will raise or elevate the chassis. The chassis will continue to elevate until the chassis bottom 40 is at the height of the outlet opening 28.

As indicated above, the chassis will weigh about 1,000 pounds (about 500 kg.) and be suppported by about 3 square feet or over 400 square inches (0.25 sq. meters). Therefore, it may be seen that a pressure of less than 2.5 pounds per square inch (0.2 kg per sq. cm.) will elevate the chassis. Therefore, it may be seen that the seals 46 do not have to withstand high pressure. Also, it will be understood that the capacity of the pump 32, being to pump cooling liquid, will be fairly high capacity and low pressure. Therefore, if a certain small amount of liquid leaks around the seals 46, this is of no great consequence inasmuch as the capacity of the pump will be sufficient to pump sufficient other liquid within the tank to elevate and support the chassis adequately.

Supply cable 58 extends through one of the side of the tanks immediately below the top 20 to the chassis 12. This cable will attach to the top of the chassis and will be about as long as the height of the chassis. Therefore, as the chassis raises, there will be no necessity of connecting or disconnecting the cable from the chassis. Also, it will be located above the liquid level and no more than a dust seal is necessary where the cable enters the tank.

It may be seen (FIG. 3) that in normal position, the chassis has about ¼" (6 mm.) clearance from the back and also has about ¼" (6 mm.) clearance on the front and the chassis has certain flanges 60 which extend to either side. Therefore it may be seen that the chassis fits snuggly with the tank 14 so that the tank 14 guides the chassis as it moves upward within the tank. Therefore, as the chassis is raised and lowered, the chassis is sufficiently held in a vertical position. Normally, if the tank is about 5 foot tall (1.5 meters), the outlet will be at least 20 inches (0.5 meter) below the top of the tank. Therefore, about ⅓ of the chassis will remain in the tank so that the chassis is stable even being fully elevated.

Although it is believed that there will be sufficient room in all circumstances for the liquid 44 which is above the chassis bottom 40 to flow from the front side of the chassis having most of the volume to behind the chassis where the fluid outlet 28 is located, I have also provided a chassis hole 62 near the bottom of the chassis. In a normal operation, the chassis hole will be closed by valve back 64, which is on the inside of the chassis. Pitman 66 attached the valve 64 to valve operator or plunger 52. Therefore, the raising of the valve operator or plunger 52 not only closes the valve 48 in the chassis bottom 40 but also opens valve 62 in the chassis back so that there is an adequate flow path for the liquid above the bottom to flow back to the outlet 28. In most circumstances, this chassis hole 62 will not be necessary but in some designs it may be. It will be understood that in normal cooling operations, the chassis hole 62 will be closed so that the main flow of the cooling liquid 44 will be around the components 10 which are on the front side of the chassis 12 in its normal operation.

It may be seen that the chassis may be lowered by either of two methods. One, the chassis may be lowered by merely turning off the circulating pump. When the circulating pump is turned off there will be an actual leakage around the seals 46 and the chassis will slowly settle to the bottom of the tank due to this natural leakage. In addition to this there will be a reverse flow through the pump 32 and, therefore, the chassis will settle to the bottom of the tank. In addition, the valve 48 may be opened by depressing the valve operator 52. This permits sufficient flow through the bottom of the chassis to cause the chassis to sink to the bottom. If it appears that the chassis is going too fast as it is about to reach the bottom the valve 48 can be closed or partially closed by manual operation.

Those having ordinary skill in the art will understand that many modifications could be used. E.g., it is indicated that the detent 54 might or might not be necessary. Whether it is used or not would depend upon whether the particular makers of the equipment thought the pressure would be sufficient to hold the valve in the upper position and also whether the valve operator 52 might accidently be dislodged.

Also, the seals 46 have been described as being made of leather or some other elastomer. It will be understood that there are various synthetic materials which might be used as long as they were compatible with the coolant.

Further, it will be understood that instead of having one single hole 42 in the chassis bottom 40, there could be a plurality of holes provided to direct the flow of cooling fluid upon the components needing the cooling most. In this regard, the chassis bottom could be particularly designed for any particular electronic components 10 which were mounted upon the chassis 12. Furthermore, those having ordinary skill in the art will understand that various baffles could be attached between the flanges 60 so that the flow of the cooling fluid would not be toward the open void area but toward the components. Baffles could be located so that those components needing more cooling received a larger flow of fluid around them.

The embodiment shown and described above is only exemplary. I do not claim to have invented all the parts, elements or steps described. Various modifications can be made in the construction, material, arrangement, and operation, and still be within the scope of my invention. The limits of the invention and the bounds of the patent protection are measured by and defined in the following claims. The restrictive description and drawing of the specific example above do not point out what an infringement of this patent would be, but are to enable the reader to make and use the invention.

As an aid to correlating the terms of the claims to the exemplary drawing, the following catalog of elements is provided:

| | |
|---|---|
| 10 components | 42 hole |
| 12 chassis | 44 liquid |
| 14 tank | 45 dry components |
| 16 bottom | 46 seal |
| 18 side | 47 opening |
| 20 tip | 48 valve |
| 22 hinge | 50 pitman |
| 24 back | 52 valve operator |
| 26 inlet | 54 detent |
| 28 outlet | 56 chassis top |
| 30 piping | 58 cable |
| 32 pump | 60 flanges |
| 34 heat exchanger | 62 chassis hole |
| 36 fan | 64 valve |
| 38 drain valve | 66 pitman |
| 40 chassis bottom | 68 feet |

I claim as my invention:

1. The process of cooling an electronic device having
   a. a tank having
      (i) a bottom,
      (ii) sides, and
      (iii) a top,
      (iv) with a uniform cross section configuration between the bottom and top,
   b. said top opening from said tank,
   c. a chassis within the tank,
   d. electronic components mounted on said chassis,
   e. cooling liquid at least partially filling said tank,
   f. a circulating pump fluidly attached to the tank, and liquid circulating from the upper portion of the tank through a heat exchanger and returned to the bottom of the tank,
   wherein the improved method comprises the following steps:
   g. sealing the bottom of the chassis to the sides of the tank, and
   h. pumping cooling liquid beneath the bottom of the chassis.

2. The invention as defined in claim 1 further comprising:
   j. raising and lowering of the chasis by
   k. opening and closing a hole in the chassis bottom.

3. In an electronic device having
   a. a tank including
      (i) a bottom,
      (ii) sides, and
      (iii) a top,
      (iv) with a uniform corss section configuration between the bottom and top,
   b. said top opening from said tank,
   c. a chassis within the tank,
   d. electronic components mounted on said chassis,
   e. cooling liquid at least partially filling said tank,
   f. a circulating pump fluidly attached to the tank, and liquid circulating from the upper portion of the tank through a heat exchanger and returned to the bottom of the tank,
   wherein the improvement comprises:
   g. said chassis having a bottom thereon,
   h. seal means between the chassis bottom and the sides of the tank preventing the liquid from going from below the chassis bottom to above the chassis bottom,
   j. a hold through the chassis bottom,
   k. a bottom valve in said hole,
   m. whereby closing the hole by the valve causes fluid from beneath the chassis bottom to elevate the chassis.

4. The invention as defined in claim 3 further comprising:
   n. said valve attached to a valve operator which extends to the top of the chassis.

5. The invention as defined in claim 3 further comprising:
   n. a space at the top of the chassis not submerged by liquid for non-submergible electronic components.

6. The invention as defined in claim 3 further comprising:
   n. a hole in the chassis,
   o. a back valve in said hole so that normally the flow of cooling liquid is over the components,
   p. said back valve connected to said bottom valve so that as one is closed the other is opened.

7. The invention as defined in claim 3 further comprising
   n. said chassis fitting snuggly within said tank thereby guiding the chassis as it is elevated within the tank.

8. The invention as defined in claim 7 further comprising:
   o. said valve attached to a valve operator which extends to the top of the chassis.

9. The invention as defined in claim 8 further comprising:
   p. a space at the top of the chassis not submerged by liquid for non-submergible electronic components.

10. The invention as defined in claim 9 further comprising:
    q. a hole in the chassis,
    r. a back valve in said hole so that normally the flow of cooling liquid is over the components,
    p. said back valve connected together so that as one is closed the other is opened.

* * * * *